United States Patent [19]
Terashi

[11] Patent Number: 6,121,173
[45] Date of Patent: Sep. 19, 2000

[54] CERAMIC SINTERED BODY AND A PROCESS FOR ITS PRODUCTION

[75] Inventor: Yoshitake Terashi, Kokubu, Japan

[73] Assignee: Kyocera Corporation, Kyoto, Japan

[21] Appl. No.: 09/064,550

[22] Filed: Apr. 22, 1998

[30] Foreign Application Priority Data

Apr. 25, 1997 [JP] Japan ..................... 9-108725
Jun. 23, 1997 [JP] Japan ..................... 9-166361

[51] Int. Cl.⁷ .................................. C04B 35/00
[52] U.S. Cl. ................................ 501/4; 501/32
[58] Field of Search ......................... 501/4, 32

[56] References Cited

U.S. PATENT DOCUMENTS 5,338,710  8/1994  Ishigame et al. ................. 501/32
5,658,835  8/1997  Onitani et al. .................... 501/9

*Primary Examiner*—Archene Turner
*Attorney, Agent, or Firm*—Hogan & Hartson, LLP

[57] ABSTRACT

The ceramic sintered body of this invention contains at least 14.9% by weight of Si calculated as $SiO_2$, 1 to 84.9% by weight of Zn calculated as ZnO, 0.1 to 15% by weight of B calculated as $B_2O_3$ and 0.1 to 10% by weight of Li calculated as $Li_2O$, and especially, a quartz crystal phase and a willemite crystal phase are precipitated. This sintered body has low dielectric constant and low dielectric loss in a high frequency region, and the thermal expansion coefficient at room temperature to 400° C. can be adjusted to 1.5 to 17 ppm/° C. For this reason, this sintered body is extremely useful as an insulated substrate for use in a wiring board for transmitting high frequency signals.

8 Claims, 9 Drawing Sheets

CERAMIC SINTERED BODY AND A PROCESS FOR ITS PRODUCTION

BACKGROUND OF THE INVENTION

1. Field of the Invention

This invention relates to a ceramic sintered body useful as an insulated body in an insulated substrate in a circuit board for transmitting high frequency signals, which sintered body can be produced by firing at a low temperature, and has a low dielectric constant or a low dielectric loss in a high frequency region.

2. Description of the Prior Art

As ceramic wiring boards, those boards which are obtained by forming a wiring layer composed of high melting metals such as tungsten or molybdenum on the surface or in the inside portion of insulated substrates composed of ceramics such as alumina have been most spread.

With highly developed information in recent years, higher speeds were required in transmitting signals in semiconductor elements mounted on a circuit board, and the integration of circuits and the density of the circuits were required to become high. Accordingly, the frequency bands of signals to be transmitted have become higher. However, conventionally known insulated substrates made of alumina ceramics are improper for trasmitting high frequency signals or high-speed transmission of signals. To trasmit signals at a high speed, the insulated substrate is required to have a low dielectric constant. However, the alumina ceramics have a high dielectric constant (9 to 9.5 at 3 GHz), and the dielectric loss in a high frequency such as microwaves or millimetric waves is high.

Very recently, there has been attracted an insulated substrate composed of a glass ceramic obtained by molding a mixture of glass and various inorganic fillers, and firing the mixture. This glass-ceramics has a low dielectric constant of about 3 to 7, and as compared with an alumina ceramic, is suitable for trasmitting high frequency signals. Furthermore, since the glass ceramics can be obtained by firing at a low temperature of 800 to 1000° C., the above process also has an advantage that co-firing with a low resistant metal such as copper, gold or silver can be performed.

However, the conventionally known glass ceramic insulated substrate can be formed by co-firing with a low resistant metal such as copper, silver or gold, but has a defect of having a high dielectric loss. Since the dielectric loss at a frequency of a microwave region of at least 10 GHz is as high as at least $20 \times 10^{-4}$, the insulated substrate does not have sufficient characteristics for use as a wiring board for transmitting high frequency signals.

Various electronic component parts are mounted on a multilayer wiring board and many input and output terminals are secured to the above multilayer wiring board, and furthermore, the multilayer wiring board is used by being connected to printed boards such as a mother board. Accordingly, this board should desirably have an approximate thermal expansion coefficient to the above electronic component parts, various terminals and the printed substrate. If the thermal expansion coefficients are greatly different from each other, when soldering is carried out at the time of providing an electronic component part or a terminal on the multilayer wiring board, or when soldering is carried out at the time of mounting the multilayer wiring board on the printed board, a large thermal stress occurs, and the thermal stress causes destruction of the multilayer wiring board, or causes disconnection in the wiring layer formed in the wiring board. Furthermore, the heat generated when the input or output of a signal into the wiring board is repeated leads to the same problem.

The wiring board formed by using the glass-ceramic insulated substrate has a problem that it is difficult to adjust the thermal expansion coefficient. In the above glass ceramic, it is difficult to adjust the thermal expansion coefficient by only adjusting a component which determines the dielectric characteristics. It is necessary to compound various thermal expansion coefficient adjusting agents in the glass ceramic. As a result, the dielectric characteristics of the glass-ceramic will be impaired.

SUMMARY OF THE INVENTION

It is an object of this invention to provide a ceramic sintered body whose thermal expansion coefficient can be adjusted within a range of 1.5 to 17 ppm/° C. and which can be formed by co-firing with a wiring conductor composed of a low resistant metal such as gold, silver or copper and has a dielectric constant, especially has a low dielectric loss tangent in a high frequency region.

According to this invention, there is provided a ceramic sintered body composed of at least 14.9% by weight of Si calculated as $SiO_2$, 1 to 84.9% by weight of Zn calculated as ZnO, 0.1 to 15% by weight of B calculated as $B_2O_3$ and 0.1 to 10% by weight of Li calculated as $Li_2O$.

According to this invention, there is provided a process for producing a ceramic sintered body, comprising steps of;

mixing various oxides or complex oxides so that an amount of an $SiO_2$ component is at least 14.9% by weight, an amount of a ZnO component is 1 to 84.9% by weight, an amount of a $B_2O_3$ component is 0.1 to 15% by weight and an amount of a $Li_2O$ component is 0.1 to 10% by weight based on the total powders, dispersing the mixed powders in a binder, molding the mixture into a predetermined shape, and firing the molded product in an oxidizing or non-oxidizing atmosphere at a temperature of 800 to 1000° C.

In the ceramic sintered body of this invention having the above composition, by adjusting the amounts of elements, it is possible to precipitate a quartz ($SiO_2$) crys:al phase or a willemite crystal phase containing Zn and Si. By precipitating these crystal phases, the dielectric constant or the dielectric loss tangent can be lowered, and the thermal expansion coefficient can be adjusted within a range of 1.5 to 17 ppm/° C. In a step of producing this sintered body, a liquid phase reaction by Li of the $Li_2O$ takes place in addition to a liquid phase reaction between B (boron) in the $B_2O_3$ component and the ZnO component; therefore, the above mixture may be fired at a low temperature of 800 to 1000° C. even in the presence of slight amounts of $B_2O_3$ and $Li_2O$. Furthermore, it is possible to precipitate various crystal phases effective for adjusting the dielectric characteristics and the thermal expansion coefficient.

Accordingly, the ceramic sintered body of this invention can be produced by co-firing a low resistant metal such as gold, silver or copper forming a wiring layer, and is very useful as an insulated substrate in a wiring board for transmitting high frequency signals.

Figure 1:
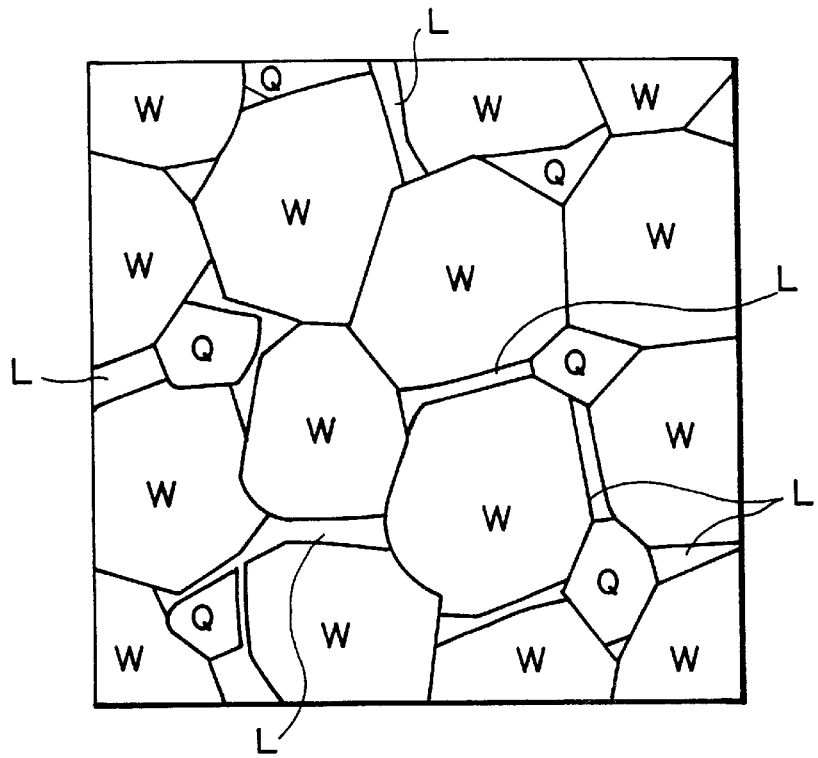
FIGS. 1 and 2 show examples of a crystal structure of the ceramic sintered body of the present invention.

DETAILED DESCRIPTION OF THE INVENTION (Production of a ceramic sintered body)

The ceramic sintered body of this invention starts from various oxide powders or complex oxide powders, but it it important that these powders should have at least $SiO_2$ component, a ZnO component, a $B_2O_3$ component, and an $Li_2O$ component in a certain ratio.

The amount of the $SiO_2$ component should be at least 14.9% by weight based on the total powders, not larger than 98% by weight, preferably not larger than 95% by weight. The most preferred amount of the $SiO_2$ should be 25 to 90% by weight based on the total powders. If the amount of the $SiO_2$ component is less than 14.9% by weight, ZnO is precipitated in an excessive amount in the resulting sintered body, and as a result, the dielectric loss of the sintered body is deteriorated. Furthermore, if the amount of the $SiO_2$ component is more than necessary, the sinterability is impaired, and it becomes difficult to obtain a densed sintered body by firing at a temperature of not higher than 1000° C.

The amount of the ZnO component should be adjusted to 1 to 84.9% by weight, especially 10 to 60% by weight, based on the total powders. If the amount of ZnO is less than 1% by weight, a sufficient liquid phase does not form in the firing step, and as a result, a densed sintered body is difficult to obtain by firing at a temperature of not higher than 1000° C. If ZnO is used in an amount of more than 84.9% by weight, ZnO is excessively precipitated in the resulting sintered body, and as mentioned above, the dielectric loss of the sintered body is deteriorated.

The amount of the $B_2O_3$ component is adjusted to 0.1 to 15% by weight, especially 1 to 5% by weight, based on the total powders. If the amount of the $B_2O_3$ component is less than 0.1% by weight, it becomes difficult to elaborate the molded mixture sufficiently by firing at a temperature of 800 to 1000° C. If the amount of the $B_2O_3$ component is larger than 15% by weight, a liquid phase forms excessively in the firing step, and the dielectric loss of the resulting sintered body is deteriorated. For example, the dielectric loss in a high frequency region at 1 to 60 GHz exceeds $30\times10^{-4}$.

The amount of the $Li_2O$ component is adjusted to 0.1 to 10% by weight, especially 1 to 5% by weight, based on the total powders. If the amount of $Li_2O$ is smaller than 0.1% by weight, it is difficult to use $SiO_2$ in a large amount, and it is difficult to adjust the thermal expansion coefficient and the dielectric characteristics. When the amount of $SiO_2$ is large, the quartz phase which is intrinsically precipitated in the sintered body is transformed into a cristobalite phase. Since the cristobalite shows a thermal expansion behavior having an inflexion point near about 200° C., the sintered body in which cristobalate is precipitated markedly changes in thermal expansion coefficient near about 200° C. and the sintered body is inadequate for use as a wiring board. If the $Li_2O$ is larger than 10% by weight, the dielectric loss of the resulting sintered body is deteriorated.

In the present invention, at least one kind of an alkali metal selected from the group consisting of K, Na, Cs and Rb can be included in an amount of 0.1 to 10% by weight, especially in an amount of 1 to 5% by weight, calculated as an oxide in the above-mentioned starting powders. By conjointly using these alkali metals together with $Li_2O$, the sinterability will be increased synergetically, and the firing at a low temperature can be carried out more effectively. If the amount of the alkali metal oxide is less than 0.1% by weight, the sinterabillity increasing effect does not appear sufficiently, and if the alkali metal oxide is used in an amount of more than 10% by weight, liquid components containing Li, B and Na are dissolved out unpreferably at a temperature of 800 to 850° C.

In the present invention, so long as the oxide components have quantitative ratios mentioned above, various oxide powders or complex oxide powders may be used as the starting powders.

For example, as supply sources for $SiO_2$ and $B_2O_3$, glass powders containing $SiO_2$ and $B_2O_3$ may be used. These glass powders are advantageous for the sinterability at low temperatures. Generally, these glass powders may be used in an amount of 0.5 to 20% by weight, especially in an amount of 1 to 10% by weight, based on the total starting powders. If the amounts of these glass powders are less than 0.5% by weight, the sinterability increasing effect at low temperatures is not sufficient. If the amounts of these glass powders exceed 20% by weight, a liquid phase forms excessively in the firing step, and as a result, the dielectric loss in a high frequency region at 1 to 60 GHz is likely to exceed $30\times10^{-4}$. Examples of such glass powders may include borosilicate-type glass, zinc borosilicate glass, and lead borosilicate glass. Among the above-mentioned glass powders, it is preferred to include 5 to 80% by weight of $SiO_2$ and 4 to 50% by weight of $B_2O_3$. It is especially preferred to include not larger than 30% by weight of $Al_2O_3$, and not larger than 20% by weight of alkali metal oxides. These glasses may be obtained by mixing oxide components in a predetermined ratio, and melting and cooling the mixture.

Supply sources of various oxide components used in addition to the glass powders mentioned above may be exemplified.

Supply sources for $SiO_2$ or ZnO include a powder of crystal $SiO_2$ (quartz), a powder of amorphous $SiO_2$, ZnO powder, and a willemite ($Zn_2SiO_4$) compound powder.

As a supply source for $B_2O_3$, examples include a $B_2O_3$ powder, and a powder of a compound capable of forming $B_2O_3$ in the firing step such as $B_2S_3$, $H_2BO_3$ and zinc botate (for example, $ZnO\bullet 2B_2O_3$ and $4ZnO\bullet 3B_2O_3$). In this case, zinc borate may act as a supply source of ZnO.

As supply sources for $Li_2O$, examples may include $Li_2O$ powder and a powder of a compound capable of forming $Li_2O$ in the firing step such as $Li_2CO_3$, $LiOH.Li_2S$, complex oxides containing Si and Li and complex oxides containing Si, Li and Zn. Examples of the complex oxides containing Si and Li include $Li_2SiO_3$, $Li_4SiO_4$, $Li_2Si_2O_5$, $Li_2Si_3O_7$, $Li_6Si_2O_7$ and $Li_8SiO_6$. Examples of the complex oxides containing Si, Li and Zn include $Li_2ZnSiO_4$ and $Zn_2(Zn_xLi_ySi_z)O_4$ [where x+y+z=1]. In this case, the above complex oxides may be a supply source for $SiO_2$ or ZnO.

As alkali metal sources for K, Na Cs and Rb, these oxides, or carbonates and nitrates capable of forming oxides in the firing step may be used.

In the present invention, various oxides or complex oxides as powders are mixed in a predetermined ratio, and known binders such as polyvinyl alcohol are added, and the mixture may be molded in a predetermined shape. The molding may be carried out by known means such as a metal mold press, a cold hydrostatic press, extrusion molding, a doctor blade method or a rolling method.

This molded product is fired in an oxidizing atmosphere, or a non-oxidizing atmosphere such as nitrogen or argon at a temperature of 800 to 1000° C., especially at 900 to 1000° C., for 0.1 to 5 hours to give a densed sintered body having a relative density of not smaller than 95%. If the firing temperature is lower than 800° C., the sintered body cannot be fully elaborated. If the firing temperature is higher than 1000° C., the sintered body can be elaborated, but a low resistant conductor such as copper or silver cannot be fired simultaneously. It becomes disadvantageous when the sintered body is used as a wiring board.

According to the method of this invention, a liquid phase composed mainly of Zn formed from the complex oxide and a B (boron) in $B_2O_3$ or in the glass form an active liquid phase reaction, and at the same time, a liquid phase reaction by the Li component in $Li_2O$ takes place. As a result, the presence of even slight amounts of $B_2O_3$ and $Li_2O$ increases sinterability at low temperatures, and it is possible to obtain a densed sintered body at a low temperature of 800 to 1000° C. Furthermore, by this procedure, the amount of an amorphous phase of the grain boundary which becomes a cause of increasing the dielectric loss can be inimized, and it is possible to obtain a ceramic sintered body having a low dielectric loss in a high frequency region.

(Ceramic sintered body)

The ceramic sintered body obtained by the above method of this invention contains elements of Si, Zn, B and Li or alkali metals of K, Na, Cs and Rb in predetermined concentrations calculated as oxides according to the composition of the starting mixed powders, but by properly selecting the types of starting powders, the resulting sintered body has a $Li_2ZnSiO_4$ structure in which various crystal phases are precipitated. As a result, the amount of the amorphous phase of the grain boundary which becomes a cause of increasing a dielectric loss tangent is suppressed to a minimum, and the sintered body has a low dielectric loss tangent in a high frequency region. According to the type or amount of the crystal precipitated, the dielectric constant can be lowered and the thermal expansion coefficient can be adjusted to 2 to 17 ppm.° C., especially to 15 to 17 ppm/° C.

Figure 2:
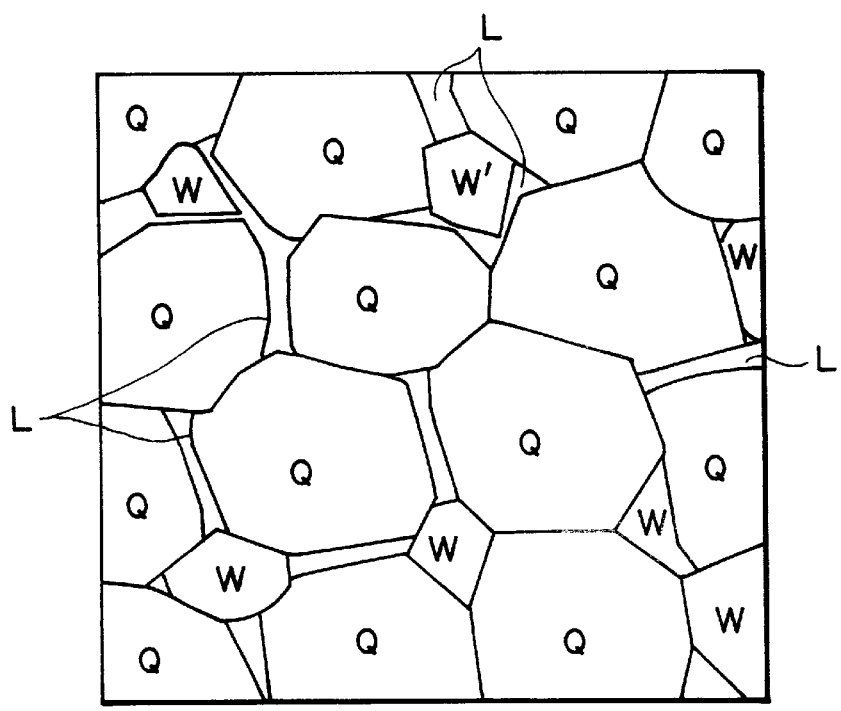

FIGS. 1 and 2 show typical crystal strutures of the ceramic sintered bodies of this invention.

The sintered body of FIG. 1 contains a main crystal phase having a willemite ($Zn_2SiO_4$) crystal phase (W) containing ZnO and $SiO_2$ and a crystal phase (Q) containing $SiO_2$ (quartz) and a crystal phase (L) containing $Li_2O$ and ZnO as sub-crystal precipitated therein.

The sintered body of FIG. 2 contains a main crystal phase having a crystal phase (Q) containing $SiO_2$ (quartz) and a willemite ($Zn_2SiO_4$) crystal phase (W) and a crystal phase (L) containing $Li_2O$ and ZnO as sub-crystal phases precipitated therein.

As examples shown in FIGS. 1 and 2, willemite ($Zn_2SiO_4$) crystal phase (W) is precipitated as corresponding to the willemite compound in the starting powder, and the quartz crystal phase (Q) is precipitated correspondent to the $SiO_2$ (quartz) powder used as the starting powder. Furthermore, the crystal phase (L) containing $Li_2O$ and ZnO corresponds to the complex oxide used as the source of $Li_2O$. For example, they include a $Li_2ZnSiO_4$-type crystal or $Zn_2(ZnxLiySiz)O_4$ (wherein x+y+z=1) in which Zn and Li are soild-dissolved in the Si site of the $Zn_2SiO_4$-type crystal. Although no description is made in FIGS. 1 and 2, an amorphous phase containing $SiO_2$, ZnO or $B_2O_3$ may exist in the grain boundary of each crystal phase.

According to this invention, by precipitating such crystal phases in the sintered body, it is possible to obtain a ceramic sintered body having a dielectric constant (εr) of 7 or less and a dielectric loss of 30×10⁻⁴ or less at a frequency of 1 to 60 GHz. Furthermore, in this sintered body, the thermal expansion coefficient at room temperature to 400° C. is a straight line, and within this temperature range, the thermal expansion coefficient is 1.5 to 17 ppm/° C. Accordingly, within this range, the thermal expansion coefficient can be adjusted. Among the above-mentioned crystal phases, the quartz crystal phase (Q) his a high thermal coefficient of 13 to 20 ppm/° C. within a range of room temperature to 400° C. Accordingly, the thermal expansion coefficient can be adjusted by adjusting the amount of the quartz crystal phase (Q) precipitated. By particularly increasing the amount of the quartz crystal phase, the thermal expansion coefficient can be increased to 15 to 17 ppm/° C. The $SiO_2$ crystals include cristobalite or tridymite in addition to quartz. These crystals have an inflexion point at about 200° C. of the thermal expansion coefficient. When the temperature exceeds the inflex point the thermal expansion coefficient of these crystals abruptly rises improperly.

In this way, the ceramic sintered body of this invention can be produced by simultaneously firing with a low resistant conductor such as copper or silver, and since in a high frequency region, the ceramic sintered body has a low dielectric constant and a low dielectric loss, the ceramic sintered body is preferably used as an insulated substrate in various wiring boards. When the ceramic sintered body of this invention is used as an insulated substrate, sheet-like molded articles (green sheets) are prepared from the starting powder and a binder, and wiring patterns are formed on these green sheets by using a metal paste such as copper or silver. By simultaneously firing the metal paste and the green sheets, the insulated substrate and the wiring layer can be formed simultaneously so that the insulated substrate can be obtained in the form of a wiring board. For example, at a predetermined position of the green sheets, through-holes are formed, and the metal paste containing a low resistant metal such as copper, gold or silver is filled in the through-holes. Thereafter, the metal paste is coated on the green sheets (in a thickness of about 5 to 30 μm) in a pattern of the wiring layer by a screen printing method or a gravure printing method. A plurality of green sheets in which the through-holes and the metal pastes form a pattern on a wiring layer are overlaid and pressed so that the through-holes agree with each other, and fired at 800 to 1000° C., especially 900 to 1000° C., in an oxidizable atmosphere or in a non-oxidizable atmosphere to give a wiring board. When copper is used as a metal conductor, the firing is carried out in a non-oxidizable atmosphere.

EXAMPLES

Experimental Example 1

Compounds represented by $Zn_2SiO_4$, $ZnO.2B_2O_3$ and $4ZnO.3B_2O_3$ having an average particle diameter of not larger than 1 μm, $SiO_2$ (amorphous) and $Li_2O$ were used as starting materials and mixed in accordance with the composition shown in Table 1. An organic binder, a plasticizer and toluene were added, and green sheets having a thickness of 300 μm were prepared by the doctor blade method. Five green sheets were laminated, and heat pressed under a pressure of 100 Kg/cm² at a temperature of 50° C. The binder was removed at 700° C. from the resulting laminated body, and the finally resulting laminated body was fired in dry nitrogen under the conditions shown in Table 1 to give a ceramic sintered body for a multilayer wiring board.

Figure 3:
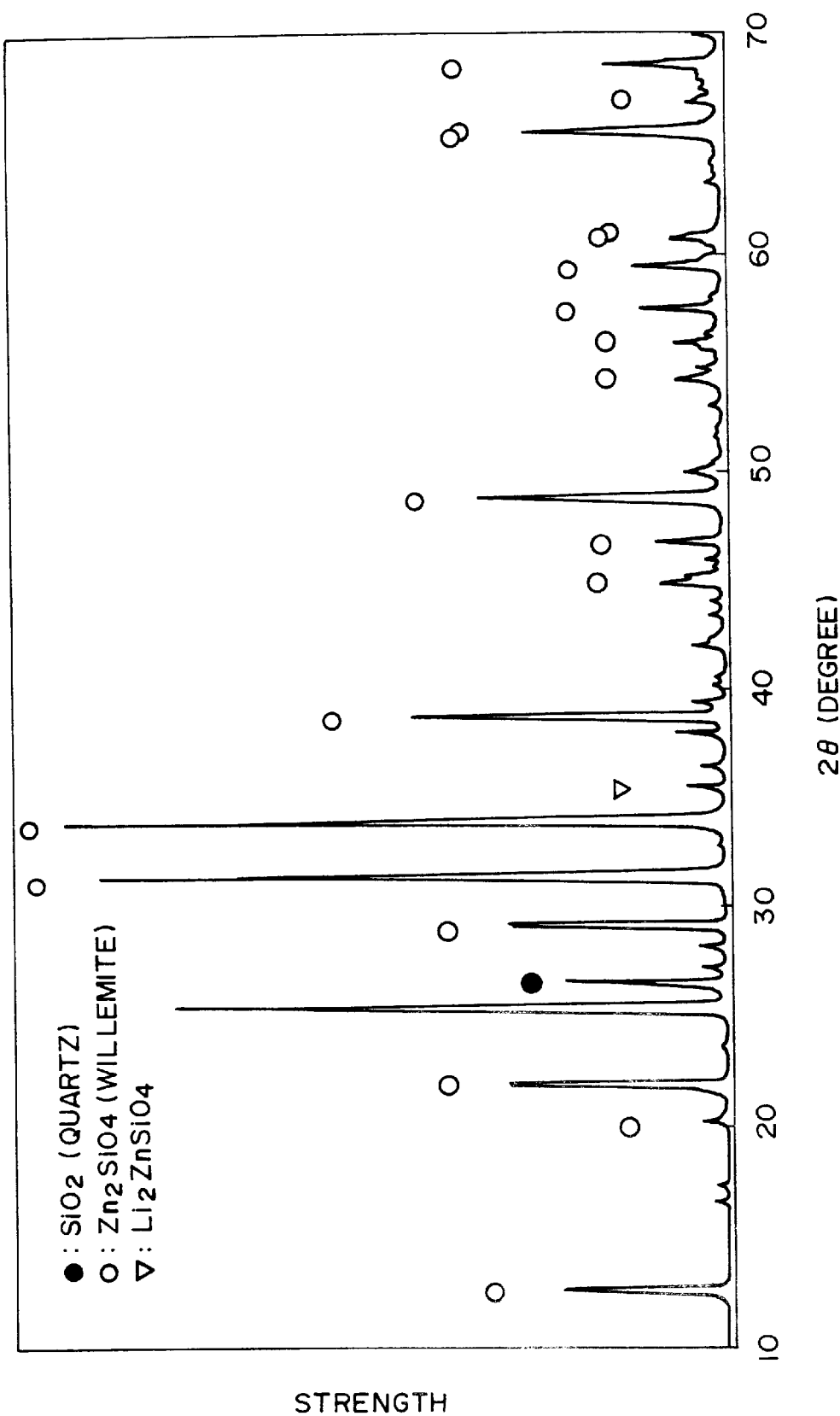
FIGS. 3 and 4 are X-ray diffraction charts of the ceramic sintered bodies of Samples Nos. 8 and 15 in Experimental Example 1.
Figure 4:
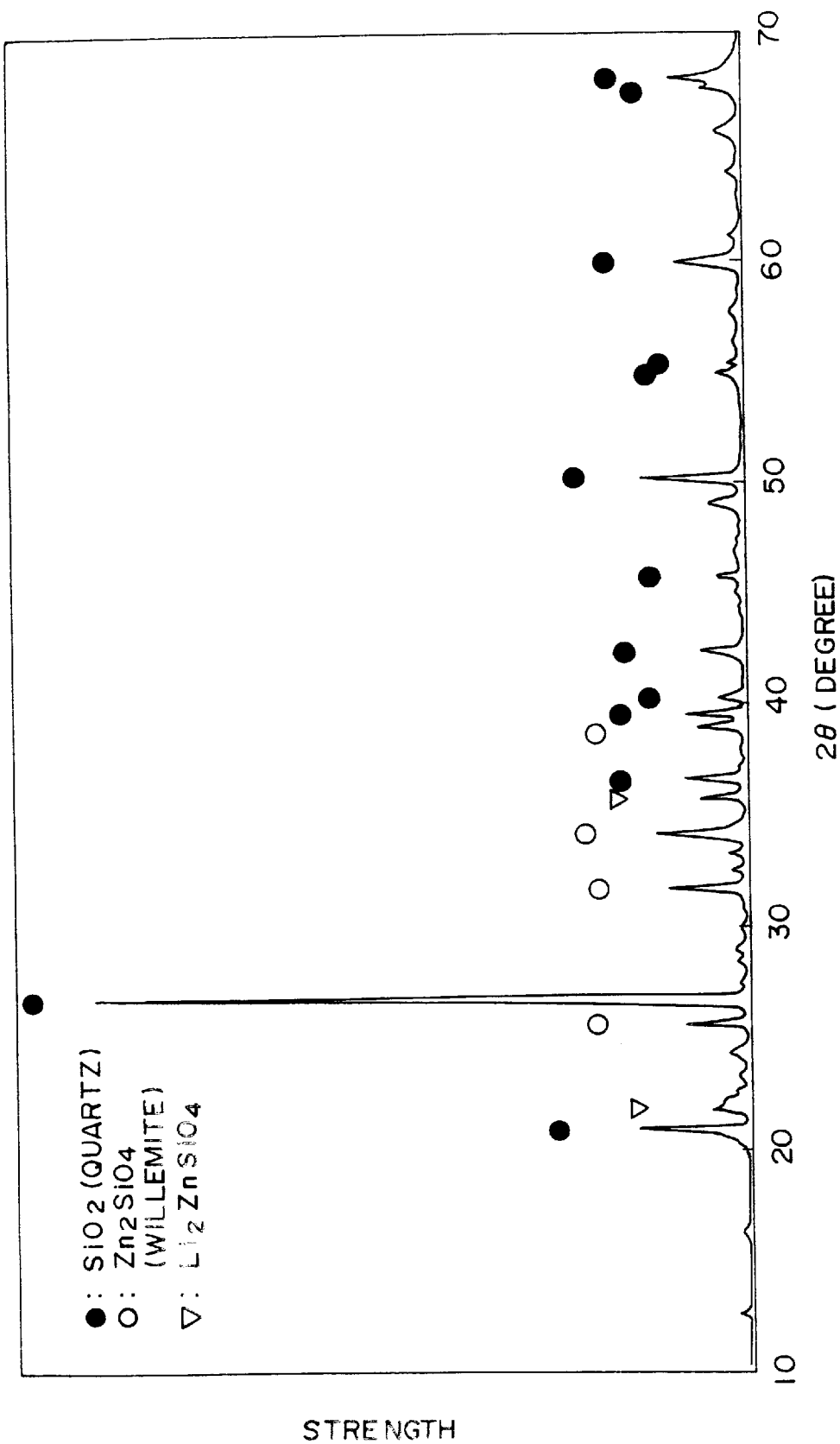
Figure 5:
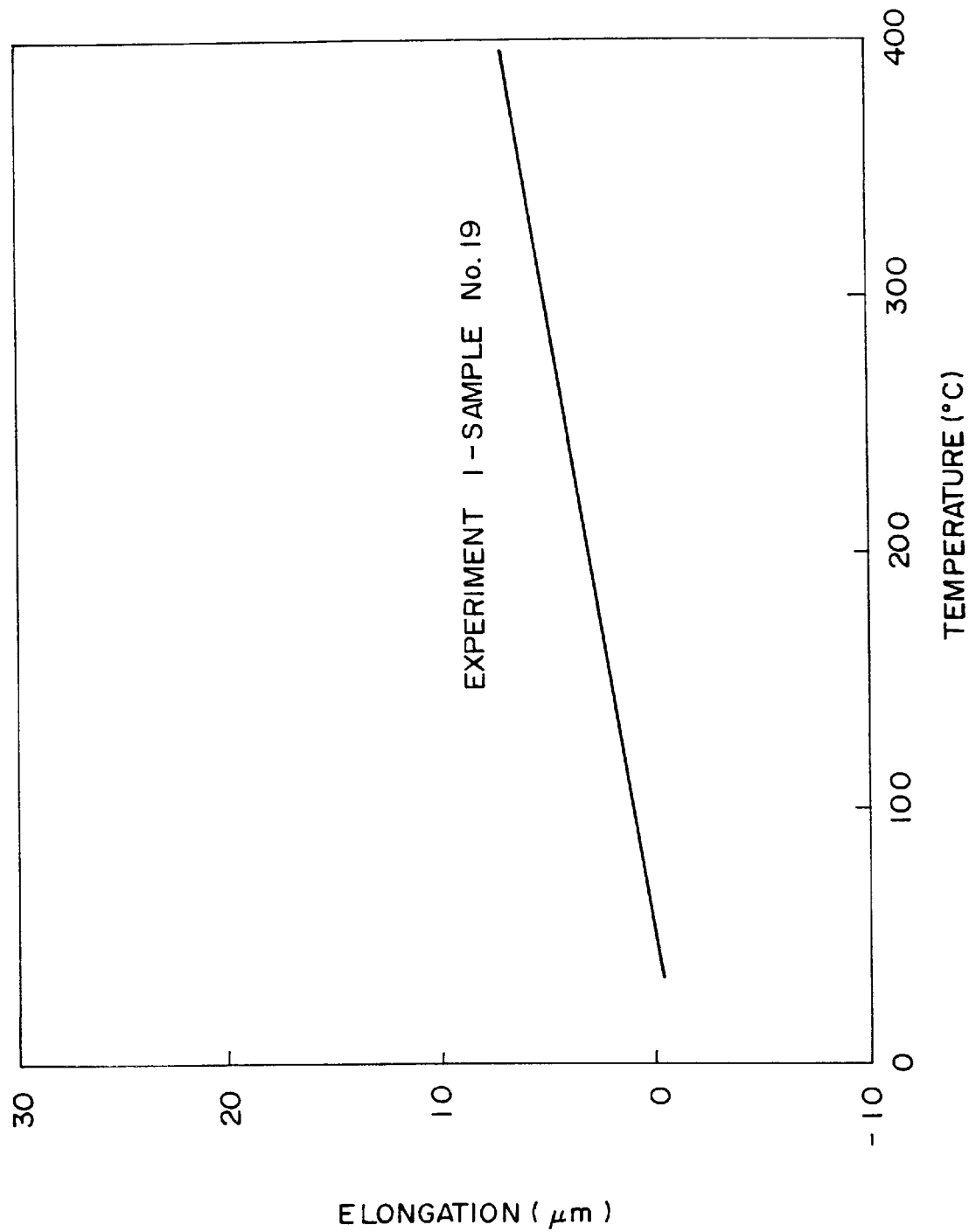
FIGS. 5 and 6 show the thermal expansion curves of the sintered ceramic sintered bodies as Samples Nos. 19 and 9 in Experimental Example 1.
Figure 6:
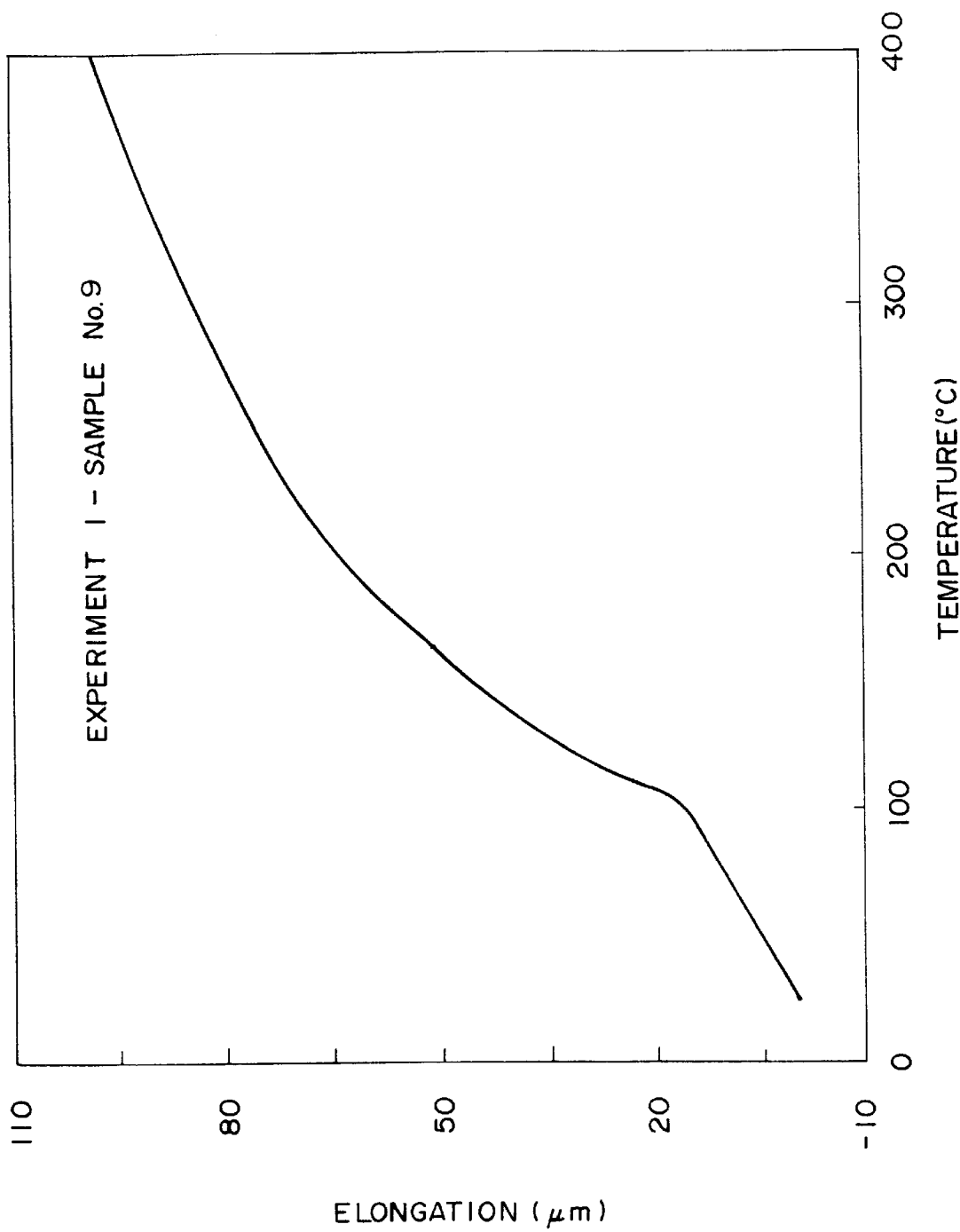

The dielectric constant and the dielectric loss tangent of the resulting sintered body were evaluated by the following methods. Samples having a diameter of 1 to 5 mm and a thickness of 2 to 3 mm were cut out, and the above properties were measured at 60 GHz by a dielectric cylindrical resonator method using a network analyzer and a synthesized sweeper. In the measurement, the dielectric resonator was excited by an NRD guide (non-radiative dielectric line) and from resonance characteristics of TE021 and TE031 modes the dielectric constant (εr) and the dielectric loss tangent (tan δ) were calculated. The results are shown in Table 1. From an X-ray diffraction measurement, crystal phases in the sintered body were identified, and samples Nos. 8 and 15 were shown in the X-ray diffraction charts of FIGS. 3 and 4. Furthermore, in each sintered body, thermal expansion coefficients (α) over a range of room temperature to 400° C. were measured. Simultaneously, the presence and absence of inflexion points in the vicinity of 200° C. in a thermal expansion curve within the temperature in the above range were confirmed. The thermal expansion curves of samples Nos. 19 and 9 were shown in FIGS. 5 and 6.

As Comparative Examples, sintered bodies were prepared and evaluated by using $MgSiO_3$ and $CaSiO_3$ instead of $Zn_2SiO_4$ and $SiO_2$ (samples Nos. 25 and 26)

resulting product was not suitable for the object of this invention. On the other hand, the sample No. 16 in which the amount of $B_2O_3$ exceeded 15% by weight increased in the dielectric loss and the dielectric characteristics of the sintered body at 60 GHz could not be evaluated. In the sample No. 9 in which the amount of $Li_2O$ was less than 0.1% by weight, a large amount of cristobalite was precipitated, and as a result, an inflection point formed in the thermal expansion curve. Incidentally, with respect to the sintered bodies of the present invention, the liquid phases formed in the firing step were analyzed by LCP emission spectroscopic analysis. From any liquid phases, Zn and B elements were detected.

TABLE 1

| Sample No. | Composition (wt. %) | | | | Firing conditions | | εr | (tan δ) × 10⁻⁴ | α (ppm/° C.) | Presence or absence of an inflexion point | Crystals phases (note 1) |
|---|---|---|---|---|---|---|---|---|---|---|---|
| | $SiO_2$ | ZnO | $Li_2O$ | $B_2O_3$ | Temp. (° C.) | Time (hr) | | | | | |
| *1  | 97.0     | 1.5   | 0.5  | 1.0  | 1600 | 1 | —   | —    | —    | —   | K, Q > W, L |
| 2   | 94.0     | 3.0   | 0.5  | 2.5  | 1000 | 3 | 3.7 | 10   | 17.1 | no  | Q > W > L |
| *3  | 90.0     | 0.5   | 2.5  | 7.0  | 1400 | 3 | —   | —    | —    | —   | Q, K > W > L |
| 4   | 90.0     | 3.0   | 5.0  | 2.0  | 1000 | 3 | 3.9 | 13   | 16.0 | no  | W > Q, L |
| 5   | 85.0     | 5.0   | 9.0  | 1.0  | 950  | 3 | 4.0 | 15   | 15.0 | no  | W > Q, L |
| 6   | 84.0     | 9.0   | 1.5  | 5.5  | 1000 | 1 | 3.9 | 11   | 16.3 | no  | W > W > L |
| 7   | 83.5     | 1.0   | 0.5  | 15.0 | 950  | 1 | 3.8 | 17   | 16.0 | no  | W > Q, L |
| 8   | 79.6     | 15.5  | 1.5  | 3.4  | 950  | 3 | 4.0 | 9    | 16.2 | no  | Q > W > L |
| *9  | 75.0     | 19.0  | 0.05 | 5.95 | 950  | 3 | 5.0 | 10   | 20.0 | yes | K > W > L |
| 10  | 74.5     | 19.4  | 1.9  | 4.2  | 875  | 1 | 4.9 | 12   | 13.1 | no  | Q > W > L |
| 11  | 70.0     | 20.0  | 1.0  | 9.0  | 950  | 3 | 4.2 | 10   | 12.0 | no  | W > Q, L |
| *12 | 60.0     | 20.0  | 13.0 | 7.0  | 950  | 3 | not measurable | | | — | Q > L > W |
| *13 | 60.0     | 30.0  | 9.95 | 0.05 | 1300 | 1 | —   | —    | —    | —   | K, Q > W > L |
| 14  | 62.95    | 17.05 | 8.0  | 12.0 | 1000 | 1 | 4.0 | 8    | 11.2 | no  | Q > W > L |
| 15  | 55.0     | 37.5  | 3.5  | 4.0  | 950  | 1 | 5.4 | 4    | 6.1  | no  | W > Q > L |
| *16 | 40.0     | 39.0  | 1.0  | 20.0 | 900  | 1 | not measurable | | | — | W > ZB |
| 17  | 38.5     | 55.0  | 4.0  | 2.5  | 900  | 1 | 5.5 | 5    | 2.4  | no  | W > Q, L |
| 18  | 36.0     | 60.0  | 3.5  | 0.5  | 975  | 1 | 5.6 | 4    | 2.4  | no  | W > Q, L |
| 19  | 30.0     | 66.0  | 3.0  | 1.0  | 875  | 1 | 5.7 | 3    | 2.0  | no  | W > Q, L |
| 20  | 25.65    | 69.35 | 2.0  | 3.0  | 900  | 1 | 6.3 | 6    | 1.8  | no  | W > Q, L |
| 21  | 23.0     | 75.0  | 0.75 | 1.25 | 850  | 1 | 6.5 | 6    | 1.7  | no  | W > Q, L |
| 22  | 18.0     | 80.5  | 0.5  | 1.0  | 850  | 1 | 6.7 | 7    | 1.6  | no  | W > Q, L |
| *23 | 10.0     | 84.0  | 1.0  | 5.0  | 900  | 1 | not measurable | | | — | Z > W > L |
| *24 | 9.0      | 90.0  | 0.5  | 0.5  | 900  | 1 | not measurable | | | — | Z > W > L |
| *25 | $MgSiO_3$ | 70   | 10   | 20.0 | 1000 | 1 | not measurable | | 4.2 | — | M > MB |
| *26 | $CaSiO_3$ | 75   | 5    | 20.0 | 975  | 1 | not measurable | | 5.1 | — | C > CB |

*marks show samples outside the range of the present invention.
Note 1)
W: willemite or willemite solid solution
ZB: $nZnO \cdot B_2O_3$
Q: $SiO_2$ (quartz)
K: $SiO_2$ (cristobalite)
L: $Li_2ZnSiO_4$
Z: ZnO
M: $MgSiO_3$
MB: $nMgO \cdot B_2O_3$
C: $CaSiO_3$
CB: $nCaO \cdot B_2O_3$ As is clear from the results of Table 1, the sintered bodies of this invention in which a willemite crystal phase ($Zn_2SiO_4$) and an $SiO_2$-type crystal phase were mainly precipitated showed an excellent dielectric constant of 7 or less and an excellent dielectric loss tangent of $30 \times 10^{-4}$ or less at 60 GHz.

On the other hand, a sample No. 1 in which the amount of $SiO_2$ exceeded 95% by weight could not be elaborated if the temperature was not elevated to 1600° C. In samples Nos. 23 and 24 in which the amount of $SiO_2$ was less than 14.9% by weight, the dielectric characteristics were greatly deteriorated. The sample No. 13 in which the amount of $B_2O_3$ was less than 0.1% by weight could not be elaborated if the firing temperature was not elevated to 1300° C. The In the sample No. 24 in which the amount of ZnO exceeded 84.9% by weight, an excessive ZnO phase was precipitated. For this reason, the dielectric loss increased, and the dielectric characteristics at 60 GHz could not be evaluated. On the other ham in the sample No. 3 in which the amount of ZnO was less than 1% by weight, an excessive $SiO_2$ phase was precipitated. Furthermore, since the it is difficult to form a liquid phase from B and Zn components in $B_2O_3$, the sample No. 3 could not be elaborated if the temperature was not elevated to 1400° C.

As Comparative Examples, the samples Nos. 25 and 26 using $MgSiO_3$ and $CaSiO_3$ were not elaborated if the amount of $B_2O_3$ was not added in an amount of at least 15% by weight. Therefore, sufficient dielectric characteristics could not be obtained, and the resulting samples were not suitable for the object of the invention.

Experimental Example 2

Glass powders A to E having the compositions shown in Table 2 were mixed with $Zn_2SiO_4$, $Li_2O$ and $SiO_2$ having an average particle diameter of not larger than 1 μm so that the compositions shown in Table 3 may be obtained. An organic binder, a plasticizer and toluene were added to the mixture and green sheets having a thickness of 300 μm were prepared by the doctor blade method. Five green sheets were laminated, and heat-pressed under a pressure of 100 Kg/cm² at a temperature of 50° C. The binder was removed from the laminated body at 700° C., and the resulting laminated body was fired in dry nitrogen under the conditions shown in Table 3 to obtain sintered bodies for a multilayered wiring board.

With regard to the sintered body, the dielectric constant (εr), the dielectric loss tangent (tan δ) were measured as in Experimental Example 1 and the crystal phases were identified as in Experimental Example 1 and the thermal expansion coefficients was evaluated as in Experimental Example 1. The results of measurements are shown in Table 3.

TABLE 2

| No. | $SiO_2$ | $B_2O_3$ | $Al_2O_3$ | ZnO | MgO | CaO | BaO | Alkali metals | Others |
|---|---|---|---|---|---|---|---|---|---|
| A | 10.4 | 45.3 | 2.5 | 35.2 | — | — | — | $Na_2O$ 6.6 | — |
| B | 9.5 | 44.0 | 4.5 | 33.5 | — | — | — | $K_2O$ 8.5 | — |
| C | 12.0 | 22.6 | 22.7 | — | 0.3 | 13.2 | — | $K_2O$ 1.4  $Na_2O$ 6.7  $Li_2O$ 12.5 | $ZrO_2$ 3.3  $TiO_2$ 1.8  SnO 3.5 |
| *D | 53.0 | — | 5.0 | 14.5 | 23.0 | — | — | — | — |
| *E | 47.5 | — | 8.5 | — | 18.0 | 4.5 | 20.0 | $Li_2O$ 1.5 | — |

TABLE 3

| Sample No. | Composition (wt. %) | | | | Firing conditions | | | | | Presence or absence of an inflexion point | Crystal phases (note 1) |
|---|---|---|---|---|---|---|---|---|---|---|---|
| | $SiO_2$ | ZnO | $Li_2O$ | Glass | Temp. (° C.) | Time (hr) | $\epsilon_r$ | (tan δ) × $10^{-4}$ | α (ppm/° C.) | | |
| *27 | 97.0 | 1.0 | 1.0 | A 1.0 | 1600 | 3 | — | — | — | — | K > Q > W, L |
| 28 | 94.0 | 1.0 | 1.0 | A 4.0 | 1000 | 3 | 3.8 | 17 | 17.2 | no | Q > W > L |
| *29 | 90.0 | 6.7 | 3.0 | A 0.3 | 1500 | 1 | — | — | — | — | Q, K > W > L |
| 30 | 84.0 | 2.0 | 6.0 | A 8.0 | 975 | 5 | 4.0 | 12 | 16.1 | no | Q > W > L |
| *31 | *80.0 | 4.95 | 0.05 | A 15.0 | 950 | 3 | 4.2 | 15 | 20.0 | yes | K > W > L |
| 32 | 75.0 | 17.0 | 4.0 | A 4.0 | 950 | 2 | 4.4 | 10 | 16.1 | no | Q > W > L |
| *33 | 70.0 | 7.0 | 1.0 | A 22.0 | 950 | 1 | not measurable | | 15.2 | no | K > ZB > W, L |
| 34 | 60.0 | 32.0 | 4.0 | A 4.0 | 975 | 1 | 4.2 | 8 | 12.3 | no | W > Q > L |
| 35 | 55.0 | 38.0 | 3.0 | A 4.0 | 950 | 1 | 5.1 | 7 | 7.1 | no | Q > W > L |
| *36 | 40.0 | 30.0 | 25.0 | A 5.0 | 900 | 3 | not measurable | | 5.2 | no | Q > L > W |
| 37 | 30.0 | 65.0 | 1.0 | A 4.0 | 900 | 1 | 5.6 | 5 | 3.1 | no | W > Q > L |
| 38 | 25.0 | 60.5 | 1.5 | A 3.0 | 875 | 1 | 5.8 | 6 | 2.4 | no | W > Q, L |
| 39 | 18.0 | 78.5 | 0.5 | A 3.0 | 875 | 1 | 6.3 | 8 | 2.2 | no | W > Q, L |
| 40 | 15.0 | 81.6 | 0.4 | A 3.0 | 875 | 1 | 6.5 | 11 | 1.8 | no | W > Q, L, Z |
| *41 | 10.0 | 86.0 | 1.0 | A 3.0 | 850 | 1 | not measurable | | 1.5 | no | Z > W > L |
| 42 | 80.0 | 7.5 | 5.5 | B 7.0 | 975 | 1 | 4.0 | 10 | 15.2 | no | Q > W > L |
| 43 | " | " | " | C 7.0 | 950 | 3 | 4.1 | 12 | 16.1 | no | Q > W > L |
| *44 | " | " | " | D 7.0 | 1500 | 1 | — | — | — | — | K, Q > W > L |
| *45 | " | " | " | E 7.0 | 1500 | 1 | — | — | — | — | K, Q > W >0 L |
| 46 | 30.0 | 65.0 | 1.0 | B 4.0 | 975 | 1 | 5.5 | 4 | 3.2 | no | W > Q, L |
| 47 | " | " | " | C 4.0 | 950 | 3 | 5.7 | 3 | 3.1 | no | W > Q, L |
| *48 | " | " | " | D 4.0 | 1300 | 1 | — | — | — | — | W > K, Q, L |
| *49 | " | " | " | E 4.0 | 1300 | 1 | — | — | — | — | W > K, Q, L |

*marks show samples outside the range of the present invention.
Note 1)
W: willemite or willemite solid solution
ZB: $nZnO \cdot B_2O_3$
Q: $SiO_2$ (quartz)
K: $SiO_2$ (cristobalite)
L: $Li_2ZnSiO_4$
Z: ZnO As is clear from Tables 2 and 3, samples adjusted to the compositions of the present invention could be elaborated at 1000° C. or less in the same way as in Experimental Example 1. A willemite crystal phase and an $SiO_2$-crystal phase were precipitated as crystal phases. These samples showed an excellent dielectric constant of 7 or less and an excellent dielectric loss tangent at 60 GHz of $30\times10^{-4}$ or less. In addition, the thermal expansion coefficients can be adjusted within a range of 1.5 to 17 ppm/° C. No inflexion point existed.

Experimental Example 3

Figure 7:
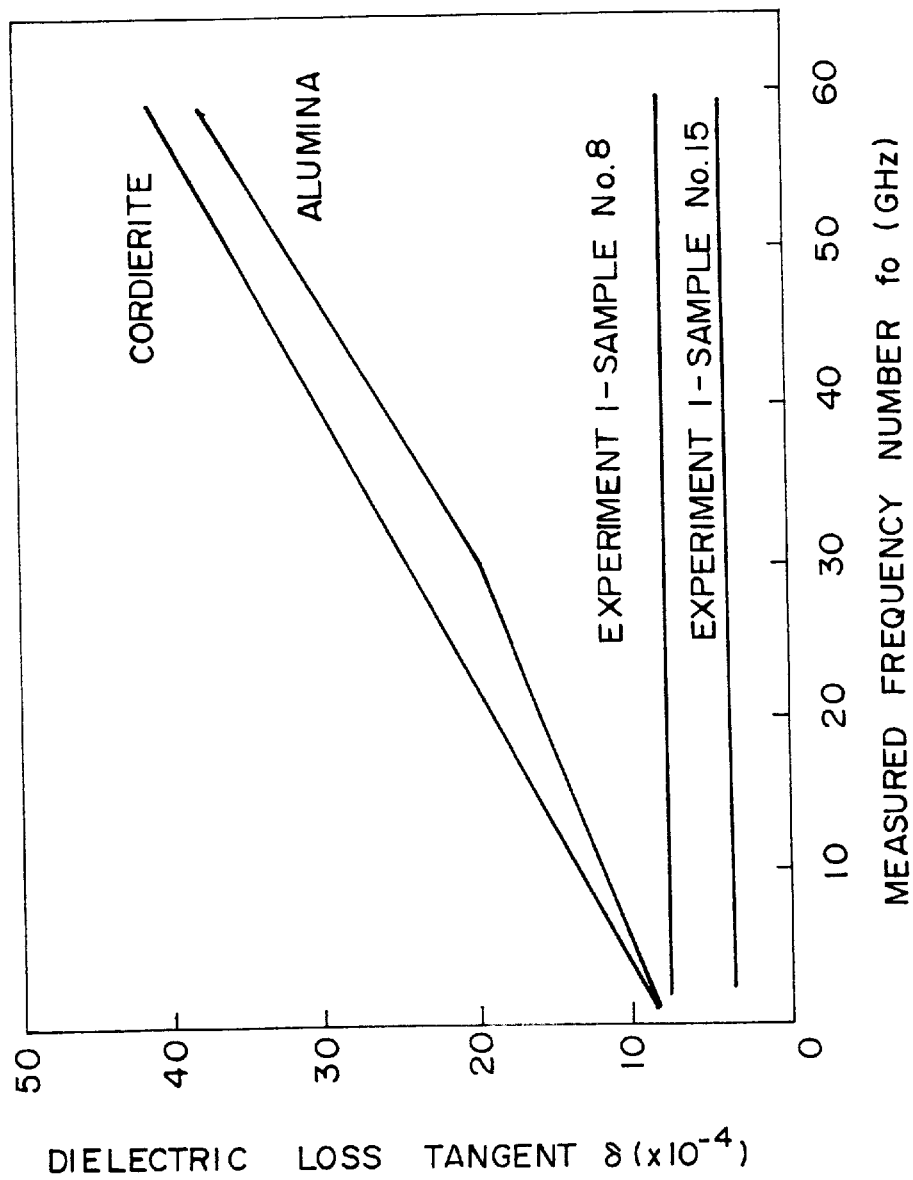
FIG. 7 shows the relation between the frequencies and the dielectric loss tangents of ceramic sintered bodies (the products of the invention) as Samples 8 and 15 and a conventionally known ceramic sintered body.

By using sintered bodies of samples Nos. 8 and 15 in Experimental Example 1, cylindrical samples having a diameter of 1 to 3 mm and a thickness of 2 to 15 mm were prepared. Furthermore, as comparisons, by using widely used cordierite-type glass ceramics (75% by weight of borosilicate glass and 25% by weight of $Al_2O_3$) and widely used low purity alumina (95% by weight of $Al_2O_3$ and 5% by weight of CaO and MgO), samples were prepared. With respect to these samples, in regions of high frequency, microwaves and millimetric waves at 1 GHz, 10 GHz, 20 GHz, 30 GHz and 60 GHz, the dielectric loss tangent was measured by a dielectric cylindrical resonator method. The results are shown in FIG. 7.

The widely used glass ceramics has a dielectric loss tangent of as low as $7\times10^{-4}$ in a low frequency region, but in a high frequency region, the characteristics will be deteriorated, and in at least 20 GHz, the dielectric loss tangent becomes about $20\times10^{-4}$. The widely used low-purity alumina has a dielectric loss tangent of as high as about $40\times10^{-4}$ at 60 GHz. On the other hand, the product of this invention has a dielectric loss tangent of as low as not larger than $30\times10^{-4}$ in a high frequency region of 60 GHz. Incidentally, the widely used glass ceramics have a dielectric constant of 5, and the low-purity alumina has a dielectric constant of 9.

Experimental Example 4

By using a $Zn_2SiO_4$ powder, a $ZnO.2B_2O_3$ powder or a $4ZnO.3B_2O_3$ powder having an average particle diameter of not larger than 1 μm, fused $SiO_2$ (amorphous) and various alkali metal carbonates as starting materials, they were mixed with each other so that the amounts of the oxides of metal elements became as shown in Tables 4 and 5. An organic binder, a plasticizer and toluene were added, and green sheets having a thickness 300 μm were prepared by the doctor blade method. Five such green sheets were laminated, and heat pressed under a pressure of 100 Kg/cm² at a temperature of 50° C. The binder was removed at a temperature of 700° C. in a steam-containing nitrogen atmosphere, and the resulting laminated body was fired in dry nitrogen under the conditions shown in Tables 4 and 5 to obtain sintered bodies for a multilayered wiring board.

Figure 8:
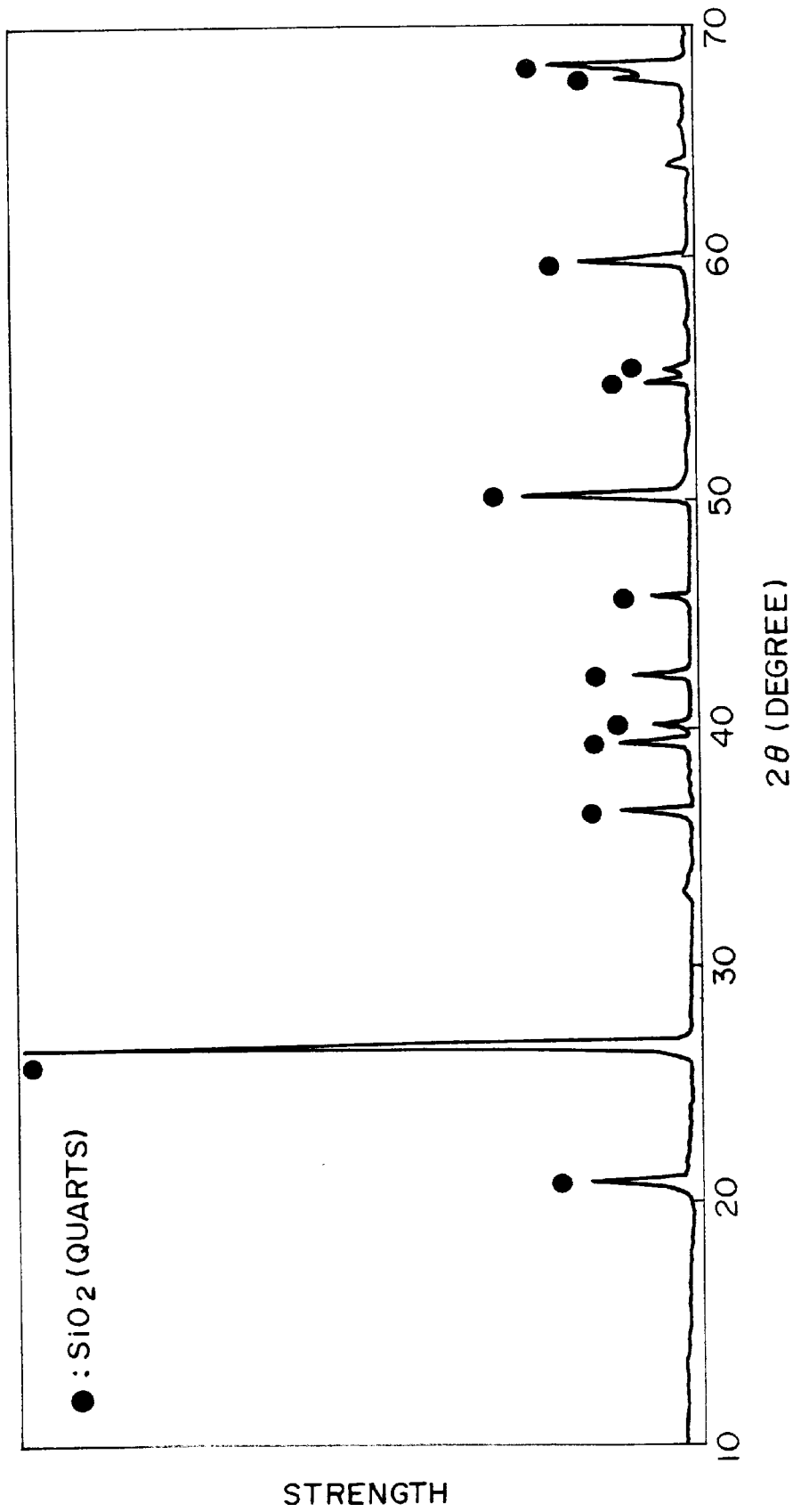
FIGS. 8 and 9 show X-ray diffraction charts of ceramic sintered bodies as Samples Nos. 4 and 8 of Experimental Example1 4.
Figure 9:
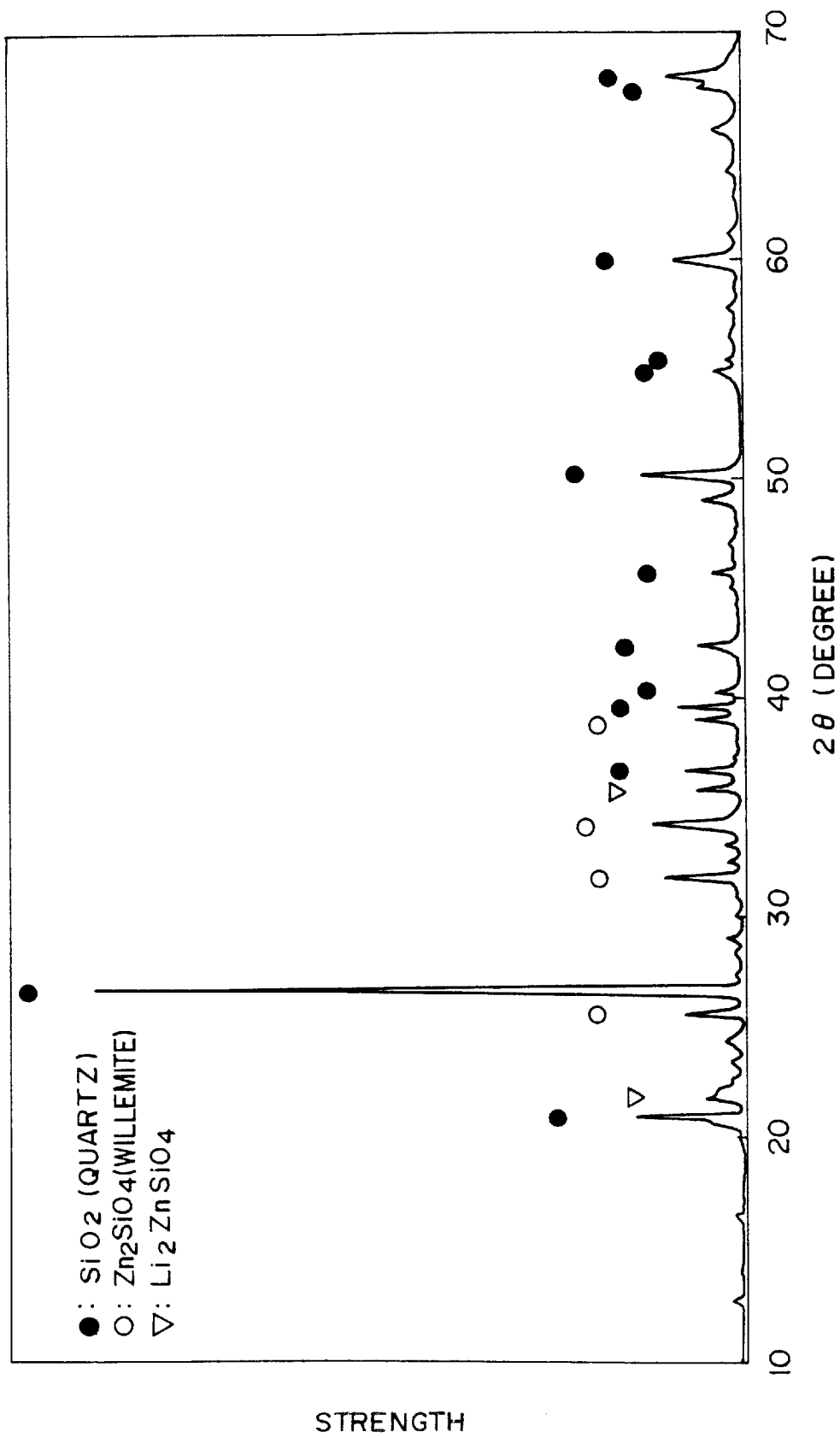

With respect to the sintered bodies, the dielectric constant (εr), the dielectric loss tangent (tan δ), and the thermal expansion coefficient (α) were measured in the same way as in Experimental Example 1. Furthermore, the crystal phases were identified by X-ray diffraction. The results are shown in Tables 4 and 5. With respect to sintered bodies as samples Nos. 4 and 8, the X-ray diffraction charts are shown in FIGS. 8 and 9.

As comparative examples, $MgSiO_3$ and $CaSiO_3$ were used as main components, and $B_2O_3$-containing compounds or alkali metaloxides were added, and sinisterd bodies were prepared from these starting materials and evaluated (samples 30 and 31).

TABLE 4

| Sample | Composition (wt. %) | | | | | Firing conditions | | | | | Crystal phases |
|---|---|---|---|---|---|---|---|---|---|---|---|
| | | | | | | Temp. | Time | | (tan δ) | α | |
| No. | $SiO_2$ | ZnO | $Li_2O$ | $B_2O_3$ | $R_2O$ | (° C.) | (hr) | εr | $\times 10^{-4}$ | (ppm/° C.) | (note 1) |
| *1 | 98.5 | 1.0 | 0.2 | 0.2 | Na 0.1 | 1000 | 3 | not elaborated | | | — |
| 2 | 98.0 | 1.0 | 0.4 | 0.3 | Na 0.3 | 950 | 1 | 4.3 | 17 | 16.5 | Q |
| *3 | 98.0 | 1.0 | 0.7 | 0.3 | — | 1000 | 3 | not elaborated | | | — |
| 4 | 94.0 | 3.0 | 1.5 | 0.5 | Na 1.0 | 900 | 1 | 4.4 | 18 | 15.0 | Q |
| *5 | 90.0 | 0.3 | 2.5 | 7.0 | Na 0.2 | 1000 | 3 | not elaborated | | | K > Q, W > L |
| 6 | 91.5 | 4.5 | 1.9 | 0.85 | Na 1.25 | 900 | 1 | 4.5 | 29 | 15.0 | Q > W, L |
| *7 | 87.6 | 9.15 | 1.5 | 1.7 | Na 0.05 | 1000 | 3 | not elaborated | | | — |
| 8 | 86.5 | 9.2 | 1.5 | 1.7 | Na 1.1 | 875 | 1 | 4.7 | 25 | 15.0 | Q > W, L |
| *9 | 83.5 | 1.0 | 0.5 | 4.0 | Na 11.0 | 900 | 1 | liquid phase was dissolved | | | — |
| 10 | 79.6 | 14.5 | 1.0 | 2.9 | Na 2.0 | 875 | 1 | 5.0 | 12 | 12.0 | Q > W > L |
| *11 | 75.0 | 19.0 | 0.05 | 5.85 | Na 0.1 | 1000 | 3 | 5.2 | 10 | 20.0 | K > W > L |
| 12 | 74.5 | 18.4 | 1.9 | 3.2 | Na 2.0 | 875 | 1 | 5.4 | 13 | 12.5 | Q > W > L |
| 13 | 70.0 | 20.0 | 1.0 | 8.0 | Na 1.0 | 900 | 1 | 5.5 | 12 | 12.0 | W > Q, L |
| *14 | 60.0 | 19.0 | 12.0 | 6.0 | Na 3.0 | 875 | 1 | liquid phase was dissolved | | | Q > L > W |
| *15 | 60.0 | 27.0 | 7.95 | 0.05 | Na 5.0 | 1000 | 3 | not elaborated | | | — |
| 16 | 62.95 | 17.05 | 3.0 | 12.0 | Na 5.0 | 900 | 1 | 5.2 | 10 | 11.0 | Q > W > L |
| 17 | 55.0 | 37.5 | 1.5 | 4.0 | Na 2.0 | 875 | 1 | 5.5 | 9 | 6.5 | W > Q > L |
| *18 | 40.0 | 39.0 | 0.5 | 20.0 | Na 0.5 | 875 | 1 | liquid phase was dissolved | | | W > ZB |
| 19 | 38.5 | 55.0 | 1.5 | 2.5 | Na 2.5 | 850 | 1 | 5.5 | 8 | 2.5 | W > Q, L |
| 20 | 36.0 | 60.0 | 1.5 | 0.5 | Na 2.0 | 900 | 1 | 5.6 | 10 | 2.4 | W > Q, L |
| 21 | 30.0 | 66.0 | 1.0 | 1.0 | Na 2.0 | 850 | 1 | 5.7 | 7 | 2.0 | W > Q, L |
| 22 | 25.65 | 69.35 | 1.0 | 3.0 | Na 1.0 | 875 | 1 | 6.3 | 8 | 1.8 | W > Q, L |
| 23 | 23.0 | 75.0 | 0.25 | 1.25 | Na 0.5 | 850 | 1 | 6.5 | 9 | 1.7 | W > Q, L |
| 24 | 18.0 | 80.5 | 0.2 | 1.0 | Na 0.3 | 850 | 1 | 6.7 | 11 | 1.6 | W > Q, L |

TABLE 4-continued

| Sample | Composition (wt. %) | | | | | Firing conditions | | (tan δ) | α | Crystal phases |
| --- | --- | --- | --- | --- | --- | --- | --- | --- | --- | --- |
| No. | $SiO_2$ | ZnO | $Li_2O$ | $B_2O_3$ | $R_2O$ | Temp. (° C.) | Time (hr) | $\epsilon r$ × $10^{-4}$ | (ppm/° C.) | (note 1) |
| *25 | 10.0 | 84.0 | 0.5 | 5.0 | Na 0.5 | 900 | 1 | not measurable | 1.4 | Z > W > L |
| *26 | 9.0 | 90.0 | 0.2 | 0.5 | Na 0.3 | 900 | 1 | not measurable | 1.3 | Z > W > L |

*marks show samples outside the range of the present invention.
Note 1)
W: willemite or willemite solid solution
ZB: $nZnO \cdot B_2O_3$
Q: $SiO_2$ (quartz)
K: $SiO_2$ (cristobalite)
L: $Li_2ZnSiO_4$
Z: ZnO

TABLE 5

| Sample | Composition (wt. %) | | | | | Firing conditions | | (tan δ) | α | Crystal phases |
| --- | --- | --- | --- | --- | --- | --- | --- | --- | --- | --- |
| No. | $SiO_2$ | ZnO | $Li_2O$ | $B_2O_3$ | $R_2O$ | Temp. (° C.) | Time (hr) | $\epsilon r$ × $10^{-4}$ | (ppm/° C.) | (note 1) |
| 27 | 94.0 | 3.0 | 1.5 | 0.5 | K 1.0 | 900 | 1 | 4.5 | 19 | 15.0 Q |
| 28 | 94.0 | 3.0 | 1.5 | 1.0 | Cs 0.5 | 850 | 1 | 4.5 | 18 | 16.0 Q |
| 29 | 94.0 | 3.0 | 1.5 | 0.5 | Rb 1.0 | 900 | 1 | 4.4 | 17 | 15.0 Q |
| *30 | $MgSiO_3$ | 70 | 4.0 | 20.0 | Na 6.0 | 1000 | 1 | not measurable | 4.2 | M > MB |
| *31 | $CaSiO_3$ | 75 | 2.0 | 20.0 | Na 3.0 | 975 | 1 | not measurable | 5.1 | C > CB |

*marks show samples outside the range of the present invention.
Note 1)
Q: $SiO_2$ (quartz)
MB: $nMgO \cdot B_2O_3$
M: $MgSiO_3$
CB: $nCaO \cdot B_2O_3$
C: $CaSiO_3$ As is clear from Tables 4 and 5, the sintered bodies of this invention in which a willemite-type crystal phase ($Zn_2SiO_4$) (W) or the quartz-type crystal phase (Q) were precipitated mainly as a crystal phase show an excellent dielectric constant of 7 or less and an excellent dielectric loss at 60 GHz of $30 \times 10^{-4}$ or less. Incidentally, with respect to the sintered bodies of the present invention, a liquid phase in the firing step was analyzed by ICP emission spectroscopic analysis. As a result, Zn and other slight amounts of B, Si, Li and Na were detected.

On the other hand, the sample No. 1 in which the amount of $SiO_2$ exceeded 98% by weight could not be elaborated if the temperature was not increased to 1400° C. The sample No. 25 in which the amount of $SiO_2$ was smaller than 14.9% by weight was greatly deteriorated in dielectric characteristics and its dielectric characteristics could not be measured. The sample 15 in which the amount of $B_2O_3$ was less than 0.1% by weight could not be elaborated if the firing temperature was not increased to 1200° C. The sample No. 15 was not suitable for the object of the invention. On the other hand, in the sample No. 18 in which the amount of $B_2O_3$ exceeded 15% by weight, a liquid phase was dissolved. In the sample No. 11 in which the amount of $Li_2O$ was smaller than 0.1% by weight, a large amount of cristobalite was precipitated, and the thermal expansion coefficient (α) exceeded 17ppm/° C. and the sample 11 was not suitable for the object of the invention. Furthermore, an inflexion point occurred in the thermal expansion curve.

In the sample No. 26 in which the amount of ZnO exceeded 84.9%, an excessive ZnO phase wan precipitated. Hence, the dielectric loss increased, and the dielectric characteristics at 60 GHz could not be evaluated. On the other hand, in the sample No. 5 in which the amount of ZnO was less than 1% by weight, an exessive $SiO_2$ caused the cristobalite phase to be precipitated. Furthermore, since the amount of Zn is insufficient, it is difficult to form a liquid phase from B and Zn components. If the firing temperature is not increased to 1300° C., the sintered body cannot be elaborated.

The sample No. 3 to which $Na_2O$ was not added could not be fired at a temperature of 1000° C. or below. As shown in the sample No. 2, when a portion of $Li_2O$ was replaced by $Na_2O$, the sample No. 2 could be elaborated at 950° C. The sample No. 7 in which the amount of $Na_2O$ was less than 0.1% by weight could not be fired at 1000° C. or less. Furthermore, in the sample No. 9 in which the amount of $Na_2O$ exceeded 10% by weight, a liquid phase was dissolved.

As comparative examples, the samples Nos. 30 and 31 using $MgSiO_3$ or $CaSiO_3$ could not be elaborated if the amount of $B_2O_3$ was added in an amount of at least 15% by weight. Thus, sufficient dielectric characteristics could not be obtained, and these samples Nos. 30 and 31 were not suitable for the object of this invention. In the sample No. 14 in which the amounts of components other than $SiO_2$ and ZnO exceeded 20% by weight, a liquid phase was dissolved.

Experimental Example 5

To $Zn_2SiO_4$ having an average particle diameter of not larger than 1 μm, the glass powders of A to E used in Experimental Example 2 or various alkali metal carbonates or fused $SiO_2$ were added so that the compositions of $SiO_2$ and ZnO other than the added glass powders and the alkali metal oxides would become as shown in Tables 6 and 7. An organic binder, a plasticizer and toluene were added to the above mixture, and green sheets having a thickness of 300 μm were prepared by the doctor blade method. Five such green sheets were laminated, and heat-pressed under a pressure of 100 Kg/cm$^2$ at a temperature of 50° C. The binder was removed from the laminated body at a temperature of 700° C. in a steam-containing nitrogen atmosphere, and the laminated body was fired in dry nitrogen under the conditions shown in Tables 6 and 7 to give sintered bodies for a multilayered wiring board.

With respect to the resulting sintered bodies, the dielectric constant ($\epsilon r$), the dielectric loss (tan δ) and the thermal expansion coefficient (α) were measured, and crystal phases were identified in the same way as in Experimental Example 1. The results of measurement are shown in Tables 6 and 7.

TABLE 6

| Sample No. | Compositons (wt. %) | | | | Firing conditions | | $\epsilon_r$ | (tan δ) × 10$^{-4}$ | α (ppm/° C.) | Crystal phase (note 1) |
|---|---|---|---|---|---|---|---|---|---|---|
| | $SiO_2$ | ZnO | $Li_2O$ | Glass | R$_2$O | Temp. (° C.) | Time (hr) | | | |
| *32 | 98.5 | 0.5 | 0.2 | A 0.5 | Na 0.3 | 1000 | 3 | not elaborated | | — |
| 33 | 97.3 | 1.0 | 0.4 | A 1.0 | Na 0.3 | 950 | 1 | 4.3 | 17 | 16.5 | Q |
| *34 | 97.3 | 1.0 | 0.7 | A 1.0 | — | 1000 | 3 | not elaborated | | — |
| 35 | 94.0 | 3.0 | 1.0 | A 1.0 | Na 1.0 | 1000 | 3 | 4.4 | 21 | 17.0 | Q |
| *36 | 90.0 | 6.7 | 2.0 | A 0.3 | Na 1.0 | 1000 | 3 | not elaborated | | Q, K > W > L |
| 37 | 84.0 | 2.0 | 2.0 | A 8.0 | Na 4.0 | 975 | 5 | 4.5 | 27 | 16.1 | Q > W > L |
| *38 | 80.0 | 4.25 | 0.05 | A 14.0 | Na 1.0 | 950 | 3 | 4.8 | 19 | 20.0 | K > W > L |
| 39 | 75.0 | 17.0 | 1.5 | A 4.0 | Na 2.5 | 950 | 2 | 4.7 | 22 | 16.1 | Q > W > L |
| *40 | 70.0 | 7.0 | 0.4 | A 22.0 | Na 0.6 | 950 | 1 | not measurable | | 15.2 | Q > ZB > W, L |
| 41 | 60.0 | 32.0 | 1.0 | A 4.0 | Na 3.0 | 875 | 1 | 4.7 | 18 | 12.3 | W > Q > L |
| 42 | 55.0 | 38.0 | 1.0 | A 4.0 | Na 2.0 | 850 | 1 | 5.1 | 17 | 7.1 | Q > W > L |
| *43 | 40.0 | 30.0 | 15.0 | A 5.0 | Na 10.0 | 900 | 3 | not measurable | | 5.2 | Q > L > W |
| 44 | 30.0 | 65.0 | 0.3 | A 4.0 | Na 0.7 | 900 | 1 | 5.6 | 9 | 3.1 | W > Q > L |
| 45 | 25.0 | 70.5 | 0.5 | A 3.0 | Na 1.0 | 875 | 1 | 5.8 | 10 | 2.1 | W > Q, L |
| 46 | 18.0 | 78.5 | 0.2 | A 3.0 | Na 0.3 | 875 | 1 | 6.9 | 7 | 2.2 | W > Q, L |
| 47 | 15.0 | 81.6 | 0.1 | A 3.0 | Na 0.3 | 875 | 1 | 6.5 | 11 | 1.8 | W > Q, L, Z |
| *48 | 10.0 | 86.0 | 0.4 | A 3.0 | Na 0.6 | 850 | 1 | not measurable | | 1.5 | Z > W > L |
| *49 | 54.0 | 30.0 | 3.0 | A 2.0 | Na 11.0 | 900 | 1 | liquid phase was dissolved | | — |
| 50 | 94.0 | 3.0 | 1.0 | A 1.0 | K 1.0 | 900 | 1 | 4.5 | 22 | 16.0 | Q |
| 51 | 93.0 | 3.0 | 1.5 | A 1.0 | Cs 1.5 | 850 | 1 | 4.4 | 21 | 16.5 | Q |
| 52 | 93.5 | 3.0 | 1.5 | A 1.0 | Rb 1.0 | 900 | 1 | 4.5 | 19 | 16.0 | Q |

*marks show samples outside the range of the present invention.
Note 1)
Q: $SiO_2$ (quartz)
W: willemite or willemite solid solution
K: $SiO_2$ (cristobalite)
L: $Li_2ZnSiO_4$
ZB: $nZNO.B_2O_3$
Z: ZnO

TABLE 7

| Sample No. | Compositons (wt. %) | | | | Firing conditions | | $\epsilon_r$ | (tan δ) × 10$^{-4}$ | α (ppm/° C.) | Crystal phase (note 1) |
|---|---|---|---|---|---|---|---|---|---|---|
| | $SiO_2$ | ZnO | $Li_2O$ | Glass | R$_2$O | Temp. (° C.) | Time (hr) | | | |
| 53 | 80.0 | 7.5 | 2.5 | B 7.0 | Na 3.0 | 975 | 1 | 4.0 | 10 | 15.2 | Q > W > L |
| 54 | " | " | " | C 7.0 | Na 3.0 | 950 | 3 | 4.1 | 12 | 16.1 | Q > W > L |
| *55 | " | " | " | D 7.0 | Na 3.0 | 1500 | 1 | — | — | — | K, Q > W > L |
| *56 | " | " | " | E 7.0 | Na 3.0 | 1500 | 1 | — | — | — | K, Q > W > L |
| 57 | 30.0 | 65.0 | 0.3 | B 4.0 | Na 0.7 | 975 | 1 | 5.5 | 4 | 3.2 | W > Q, L |
| 58 | " | " | " | C 4.0 | Na 0.7 | 950 | 3 | 5.7 | 3 | 3.1 | W > Q, L |
| *59 | " | " | " | D 4.0 | Na 0.7 | 1300 | 1 | — | — | — | W > K, Q, L |
| *60 | " | " | " | E 4.0 | Na 0.7 | 1300 | 1 | — | — | — | W > K, Q, L |

*marks show samples outside the range ot the present invention.
Note 1)
Q: $SiO_2$ (quartz)
W: willemite or willemite solid solution
K: $SiO_2$ (cristobalite)
L: $Li_2ZnSiO_4$ As is clear from the results of Tables 6 and 7, samples adjusted to the compositions defined in this invention could be elaborated at 1000° C. or less in the same way as in Experimental Example 1. As crystal phases, a willemite crystal phase and a $SiO_2$-type crystal phase were mainly precipitated, and the sintered bodies showed an excellent dielectric constant ($\epsilon r$) of 7 or less and a dielectric loss (tan δ) of $30\times10^{-4}$ or less. In addition, the thermal expansion coefficient ($\alpha$) could be adjusted within a range of 1.5 to 17 ppm/° C., and no inflexion point existed.

Experimental Example 6

Figure 10:
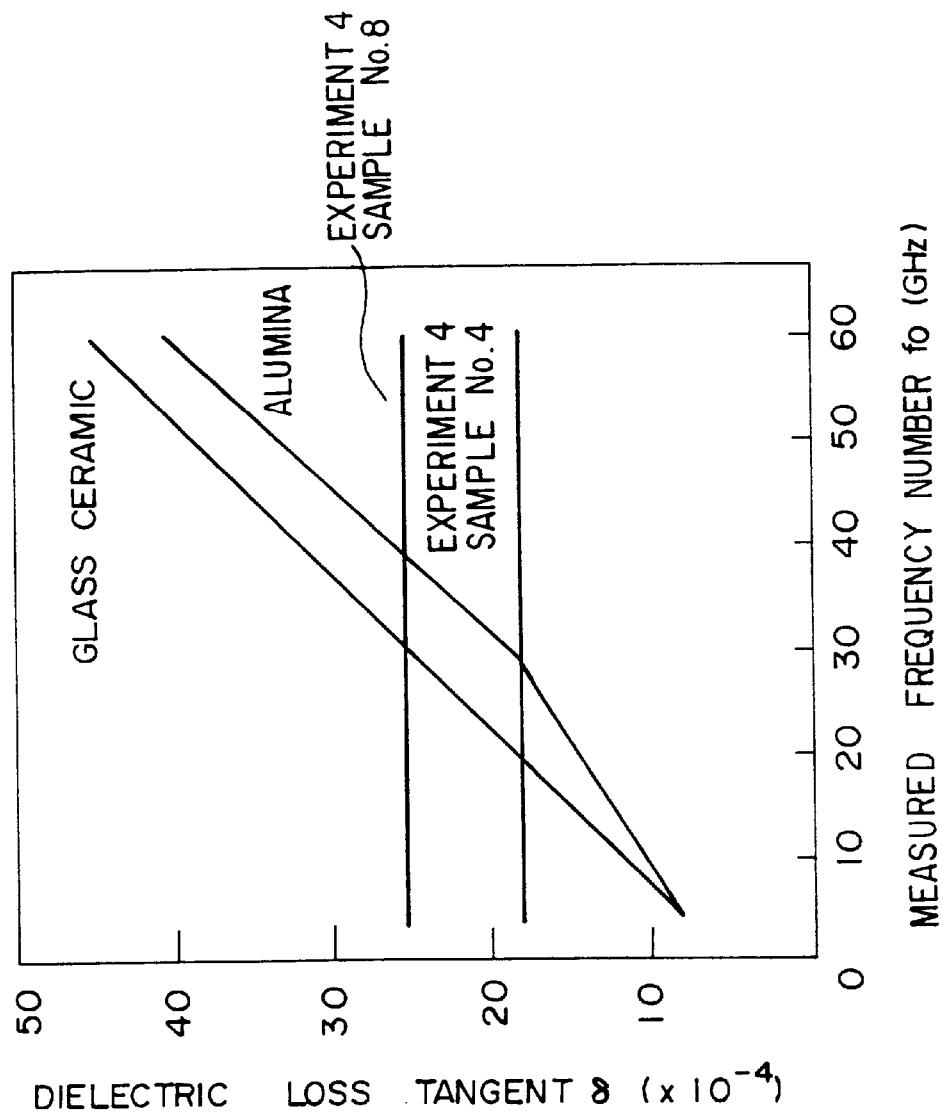
FIG. 10 shows the relation between the frequencies and the dielectric loss tangents of ceramic sintered bodies (the products of the invention) as Samples Nos. 4 and 8 of Experimental Example 4 and a conventionally known ceramic sintered body.

Using the sintered bodies of samples Nos. 4 and 8 of Experimental Example 4, cylindrical samples having a diameter of 1 to 30 mm and a thickness of 2 to 15 mm were prepared. As comparisons, a widely used cordierite-type glass ceramics (75% by weight of borosiliate glass and 25% by weight of $Al_2O_3$) and a widely used low-purity alumina (95% by weight of $Al_2O_3$ and 5% by weight of CaO and MgO) were used to prepare samples in the same way. By using the prepared samples, the dielectric losses of these samples were measured by a dielectric cylindrical resonator method in a high frequency, microwave and millimetric wave region at 1 GHz, 10 GHz, 20 GHz, 30 GHz, and 60 GHz. The results are shown in FIG. 10.

The widely used glass ceramics had a dielectric loss of as low as $7\times10^{-4}$ in a low frequency region, but in a high frequency region, the above characteristic was deteriorated, and in at least 20 GHz, the dielectric loss was about $20\times10^{-4}$. The widely used low-purity alumina gave a high dielectric loss of about $40\times10^{-4}$ at 60 GHz. On the other hand, the product of this invention had a low dielectric loss of $30\times10^{-4}$ or less at 60 GHz in a high frequency region. Incidentally, the dielectric constant was 5 in the widely used glass ceramics, and was 9 in the low-purity alumina.

What is claimed:

1. A ceramic sintered body containing at least 14.9% by weight of Si calculated as $SiO_2$, 1 to 84.9% by weight of Zn calculated as ZnO, 0.1 to 15% by weight calculated as $B_2O_3$ and 0.1 to 10% by weight of Li calculated as $Li_2O$, wherein a quartz ($SiO_2$) crystal phase is formed.

2. A ceramic sintered body of claim 1 wherein at least one element selected from the group consisting of K, Na, Cs and Rb is included in an amount of 0.1 to 10% by weight calculated as an oxide.

3. A ceramic sintered body of claim 1 wherein a willemite crystal phase containing ZnO and $SiO_2$ and a crystal phase containing $SiO_2$, $Li_2O$ and ZnO are formed.

4. The ceramic sintered body of claim 3, wherein said quartz crystal phase is the predominate phase.

5. The ceramic sintered body of claim 4, wherein said willemite crystal phase is the predominate phase.

6. A ceramic sintered body containing at least 14.9% by weight of Si calculated as $SiO_2$, 1 to 84.9% by weight of Zn calculated as ZnO, 0.1 to 15% by weight of B calculated as $B_2O_3$ and 0.1 to 10% by weight of Li calculated as $Li_2O$, said ceramic sintered body having a dielectric constant ($\epsilon r$) of 7 or less and a dielectric loss of $30\times10^{-4}$ or less in a frequency of 1 to 60 GHz, and also has a thermal expansion coefficient of 1.5 to 17 ppm/° C. in a range from room temperature to 400° C.

7. A ceramic sintered body consisting essentially of Si, Zn, B, Li and O, wherein Si is contained in an amount of at least 14.9% by weight calculated as $SiO_2$, Zn is contained in an amount of 1 to 84.9% by weight calculated as ZnO, B is contained in an amount of 0.1 to 15% by weight calculated as $B_2O_3$ and Li is contained in an amount of 0.1 to 10% by weight calculated as $Li_2O$.

8. A ceramic sintered body consisting essentially of Si, Zn, B, Li, O and at least one element selected from the group consisting of K, Na, Cs and Rb, wherein Si is contained in an amount of at least 14.9% by weight calculated as $SiO_2$, Zn is contained in an amount of 1 to 84.9% by weight calculated as ZnO, B is contained in an amount of 0.1 to 15% by weight calculated as $B_2O_3$, Li is contained in an amount of 0.1 to 10% by weight calculated as $Li_2O$, and wherein said element is included in an amount of 0.1 to 10% by weight calculated as an oxide.

* * * * *